United States Patent
Cheng et al.

[11] Patent Number: 5,873,984
[45] Date of Patent: Feb. 23, 1999

[54] METHOD OF SPUTTERING AN AMORPHOUS CARBON OVERCOAT AS A PROTECTIVE FILM ON MAGNETIC RECORDING DISK

[75] Inventors: Fu-Wen Cheng, Chung-li, Taiwan; James Liang, Piscataway, N.J.; Tain-Wong Hung, Tao-yuan Hsien; Hung-huei Liang, Chang-hwa Hsien, both of Taiwan

[73] Assignee: Trace Storage Tech. Corp., Hsinchu, Taiwan

[21] Appl. No.: 964,525

[22] Filed: Nov. 5, 1997

[51] Int. Cl.$^6$ .................................................. C23C 14/35
[52] U.S. Cl. ..................................... 204/192.16; 204/192.2
[58] Field of Search ........................ 204/192.15, 192.16, 204/192.2, 192.25, 192.26

[56] References Cited

U.S. PATENT DOCUMENTS 5,679,431  10/1997  Chen et al. ........................ 204/192.2

FOREIGN PATENT DOCUMENTS 63-210268  8/1988  Japan ................................. 204/192.15

*Primary Examiner*—Nam Nguyen
*Assistant Examiner*—Rodney G. McDonald
*Attorney, Agent, or Firm*—W. Wayne Liauh

[57] ABSTRACT

A thin-film magnetic recording media is prepared which contains a carbon overcoat sputtered on a magnetic recording layer. The carbon overcoat is sputtered on the magnetic recording layer using a sputtering process which is conducted in a sputtering chamber having an inert gas and a mixture of nitrogen gas and hydrogen gas, wherein said nitrogen gas and hydrogen gas are provided at a mole ratio of nitrogen/hydrogen between about 0.5 and about 1. The hydrogen and nitrogen doped amorphous carbon overcoat exhibits excellent mechanical properties and tribological performance.

7 Claims, 6 Drawing Sheets

METHOD OF SPUTTERING AN AMORPHOUS CARBON OVERCOAT AS A PROTECTIVE FILM ON MAGNETIC RECORDING DISK

FIELD OF THE INVENTION

The present invention relates to a method for sputtering an amorphous carbon overcoat on a magnetic recording disk to serve as a protective film, and the carbon overcoat prepared in accordance therewith. More specifically, the present invention relates to a method for sputtering an amorphous carbon overcoat, which, when applied as a protective film on a thin-film magnetic recording disk, exhibits improved mechanical properties and tribological performance.

BACKGROUND OF THE INVENTION

Thin-film magnetic recording media have been increasingly and extensively used in the manufacturing of hard disks to facilitate read/write operations in computers. Thin-film magnetic recording media are typically prepared by sputtering a thin magnetic film, or the so-called magnetic recording layer, on a substrate, which is typically a textured aluminum or Ni/P substrate. A chromium or chromium-alloy underlayer is typically provided which is sandwiched between the magnetic recording layer and the substrate. After the magnetic recording layer is sputtered on the chromium underlayer, a protective overcoat layer, which is typically an amorphous carbon film (a:C), is then applied over the metal alloy magnetic recording layer, also by sputtering. The magnetic recording layer can be cobalt-based alloy.

As the need as well as consumers' appetite for higher density recording media become more and more demanding, the flying height of the magnetic head is forced to become lower and lower, to the level of "near to contact", relative to the magnetic recording media. As a result, the mechanical strength and the tribological characteristics of the protective layer have become an important topic in order to further improve the performance, including the recording density, of the magnetic recording media.

It was discovered by J. K. Lee et al that the presence of a sufficient amount of hydrogen in the sputtering chamber could result in a carbon film which will exhibit superior mechanical characteristic. See J. K. Lee et al, IEEE Transactions on Magnetics, Vol 29, No. 1, January 1993. It was also predicted that carbon nitride film could be harder than a diamond film. See, e.g., A. Y. Liu and M. L. Cohen, Science 245, 841 (1989). Their prediction was supported by the observations of Andrei Khurshuov and Tse-An Yeh et al, who reported that carbon nitride material has the characteristics of high hardness, high wear resistance, and low friction. See Andrei Khurshudov et al, J. Vac. Sci. Technol. A14 (5), September/October 1996, and Tse-An Yeh et al. IEEE Transaction on Magnetics, Vol 27, No. 6, November 1991.

While hydrogen and nitrogen showed beneficial results when they are individually introduced into the sputtering chamber during the preparation of the amorphous carbon overcoat, there have not been any prior art reports which would suggest a commingling of these two gases. The reason may be due to some adverse effects that might have been observed when the hydrogen gas is mixed with the nitrogen gas in the sputtering chamber. One notable deterrence against commingling the hydrogen gas with the nitrogen gas is that the presence of hydrogen in a nitrogen doped film would cause the contact angle to be increased, thus adversely affecting the tribological characteristic of the amorphous carbon film.

With the capacity of the hard disks now being in the gigabytes range, every element of the hard disk is important. The mechanical and tribological properties of the overcoat film can greatly affect the gliding height of the magnetic head as well as the service life of the magnetic recording disk. Thus, it is important to explore new way to further improve the characteristics of the amorphous carbon overcoat film.

SUMMARY OF THE INVENTION

The primary object of the present invention is to develop an improved amorphous carbon overcoat which is sputter deposited on a magnetic recording disk to serve as a protective film. More specifically, the primary object of the present invention is develop to an improved method for sputtering an amorphous carbon overcoat, which, when serves as a protective film on a thin-film magnetic recording disk, would exhibit improved mechanical properties and provide enhanced tribological performance.

In the method disclosed in the present invention, both hydrogen and nitrogen gases are introduced in the sputtering chamber, at a $N_2/H_2$ ratio between about 0.5 and about 1.0. The resultant nitrogen and hydrogen doped amorphous film, or a:C—N—H film, exhibits unexpectedly superior results in that it provides improved characteristics in both mechanical property and tribological performance. In other words, the inventors have discovered that, contrary to the conventional thinking, the commingling of nitrogen and hydrogen gases can provide unexpected beneficial results, provided that they are employed at a ratio within a specific window, preferably between about 0.5 and about 1.0. If the nitrogen/hydrogen gases are provided at a $N_2/H_2$ ratio lower than 0.5, the present of hydrogen, in the presence of nitrogen, would adversely affect the tribological characteristic of the carbon overcoat by increasing its contact angle with respect to the lubricating layer. On the other hand, if the nitrogen/hydrogen gases are provided at a $N_2/H_2$ ratio greater than 1.0, the benefits of introducing the hydrogen gas, which increases the $sp^3$ structure in the a:C film, would be neutralized.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved method for sputter depositing an amorphous carbon overcoat on a magnetic recording disk to serve as a protective film. In the method disclosed in the present invention, contrary to the conventional thinking, both hydrogen and nitrogen gases are introduced in the sputtering chamber, at a $N_2/H_2$ ratio between about 0.5 and about 1.0. The resultant hydrogen and nitrogen doped amorphous carbon film, or a:C—N—H film, exhibits unexpectedly superior results in that it provides improved characteristics in both mechanical property and tribological performance. Contrary to the prior art teachings, the commingling of nitrogen and hydrogen gases can provide unexpectedly beneficial results, if that they are employed at a ratio within a specific window, preferably between about 0.5 and about 1.0.

Test results that will follow show that, if the nitrogen/hydrogen gases are provided at a $N_2/H_2$ ratio lower than 0.5, the present of hydrogen, in the presence of nitrogen, would adversely affect the tribological characteristic of the carbon overcoat by increasing its contact angle with respect to the lubricating layer. On the other hand, if the nitrogen/hydrogen gases are provided at a $N_2/H_2$ ratio greater than 1.0, the benefits of introducing the hydrogen gas, which increases the $sp^3$ structure in the a:C film, would be diminished.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLES

A number of carbon films were sputter deposited on a 95 mm textured Al substrate under various sputtering environments using a DC magnetron sputtering system. The base pressure was less than $2 \times 10^6$ torr and the sputtering pressure was about 7.0 mtorr. The sputtering gas was a mixture of Ar, $N_2$, and $H_2$, with varied $N_2/H_2$ ratios, and the film thickness was kept at 15 nm. The structures of the carbon films were characterized by Raman Spectroscopy using 514 nm Ar laser at a power of 30 mW. The scanning range was from 500 $cm^{-1}$ to 2,500 $cm^{-1}$, and the Raman spectrum was deconvoluted with a mixture of Lorentzian and Gaussian distribution functions. In measuring the contact angle, 1 $\mu l$ of distilled water was used for every measurement. Prior to the measurement, the surfaces of the disks had been exposed in a clean room environment for 24 hr before the measurement. The measurements were conducted at a temperature of about 22° C. and relative humidity RH of about 50%. During the single disk contact start stop (SDCSS) tests, the sample disks were coated with a thin layer of lubricant (about 20 Å) on the surface thereof.

Figure 1:
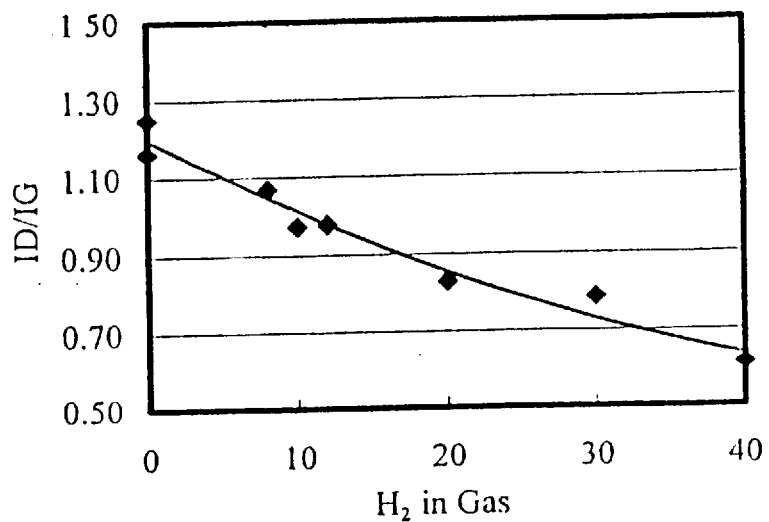
FIG. 1 is a plot of Raman intensity ratio I(D)/I(G) measured from a carbon film versus mole % of hydrogen in the sputtering gas.
Figure 2:
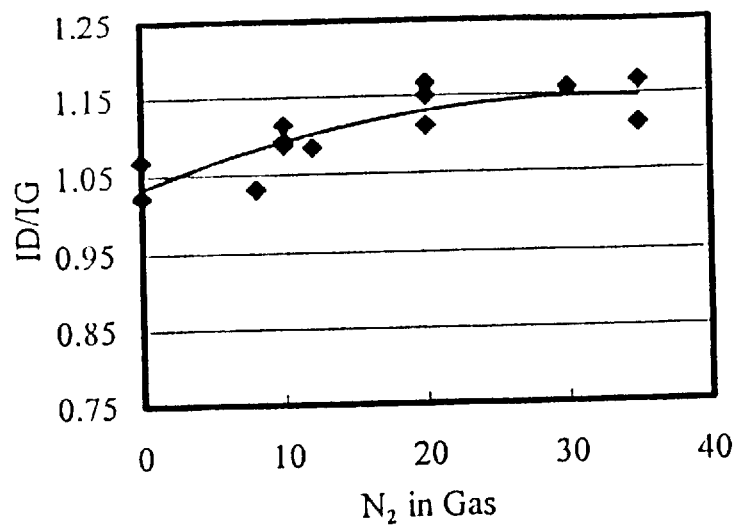
FIG. 2 is a plot of Raman intensity ratio I(D)/I(G) measured from a carbon film versus mole % of nitrogen in the sputtering gas.

FIG. 1 is a plot of I(D)/I(G) measured from a carbon film versus mole % of hydrogen in the sputtering gas. And FIG. 2 is a plot of I(D)/I(G) measured from a carbon film versus mole % of nitrogen in the sputtering gas. In Raman spectrum, the peak around 1355 $cm^{-1}$ is defined as I(D), and the peak around 1575 $cm^{-1}$ is defined as I(G). A smaller value of I(D)/I(G) indicates a greater extent of $sp^3$ structure in the amorphous carbon film, or a:C, film, thus is preferred. FIG. 1 shows that the measured value of I(D)/I(G) decreases with increased $H_2$ concentration, indicating that the hydrogen in the amorphous carbon film will stabilize and promote the formation of $Sp^3$ structure.

On comparison, FIG. 2 shows that the measured value of I(D)/I(G) decreases with increased $N_2$ concentration, indicating that the presence of nitrogen will hinder the formation of $sp^3$ structure.

Figure 3:
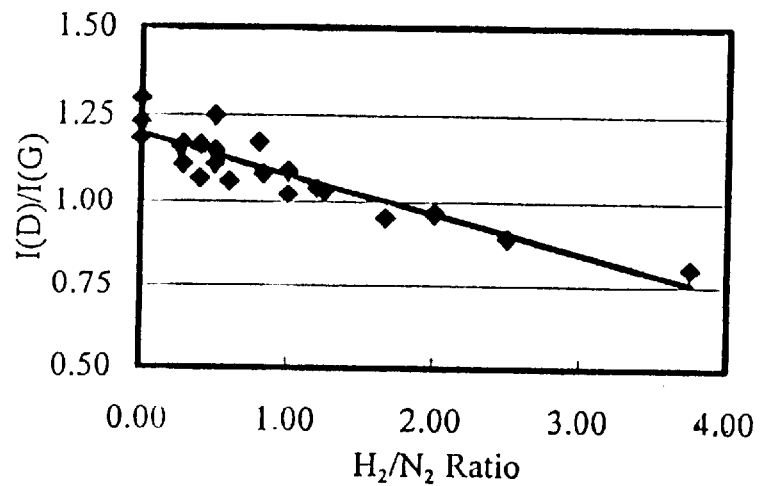
FIG. 3 is a plot of Raman intensity ratio I(D)/I(G) measured from a carbon film versus $H_2/N_2$ ratio in the sputtering gas.

FIG. 3, which is a plot of I(D)/I(G) measured from the sputtered carbon film versus $H_2/N_2$ ratio in the sputtering gas, shows that the intensity ratio I(D)/I(G) measured from the hydrogen and nitrogen doped amorphous carbon film decreased continuously with increased $H_2/N_2$ ratio. This would suggest sputtering the carbon film at a very high $H_2/N_2$ ratio. However, because of the high contact angle of hydrogen doped carbon film in the presence of nitrogen, prior art has strongly discouraged the commingling of these gases.

Figure 4:
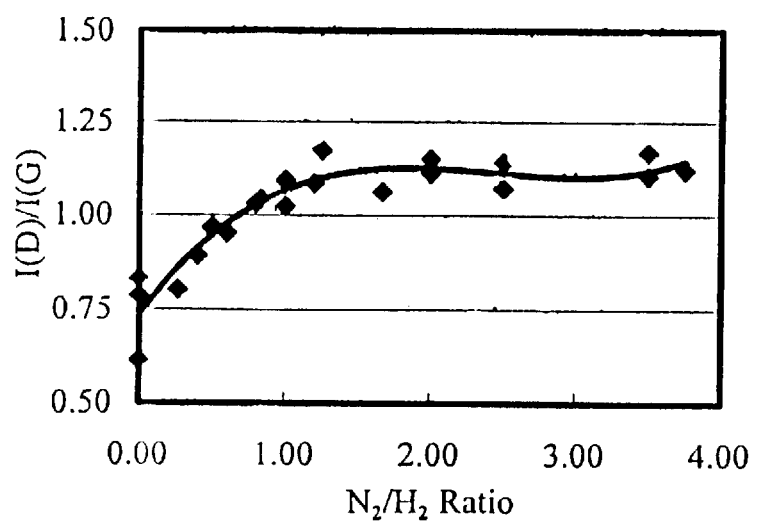
FIG. 4 is a plot of Raman intensity ratio I(D)/I(G) measured from a carbon film versus $N_2/H_2$ ratio in the sputtering gas.

However, an examination of FIG. 4, which is a plot of I(D)/I(G) measured from a carbon film versus $N_2/H_2$ ratio in the sputtering gas, indicates that some benefits, in terms of reducing the intensity ratio I(D)/I(G), can be obtained if the $N_2/H_2$ ratio is maintained below 1. This observation formed an important basis of the present invention.

Figure 5:
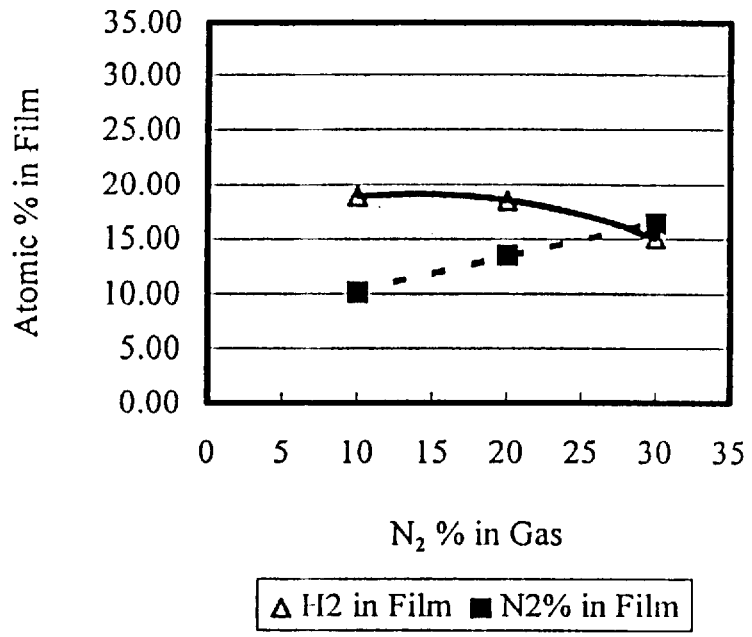
FIG. 5 is a plot of the atomic % of hydrogen and nitrogen measured in a carbon film versus $N_2$% in the sputtering gas; the amount of the hydrogen gas was fixed at 10 mole %.

FIG. 5 is a plot of the atomic % of hydrogen and nitrogen measured in a carbon film versus $N_2\%$ in the sputtering gas; the amount of the hydrogen gas is fixed at 10 mole %. FIG. 5 shows that when the $N_2\%$ in the sputtering gas increased, the nitrogen atom density in the carbon film increased slightly, while the hydrogen atom density decreased. This indicates that the hydrogen atom in the carbon film was replaced by the nitrogen atom.

Figure 6:
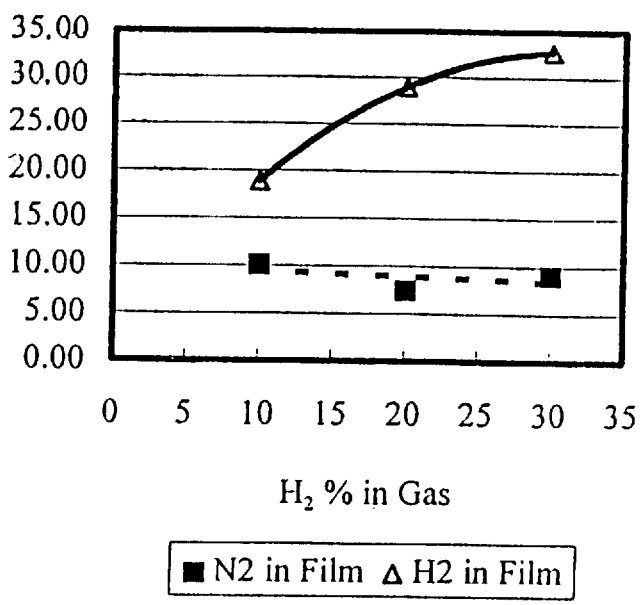
FIG. 6 is a plot of the atomic % of hydrogen and nitrogen measured in a carbon film versus $H_2$% in the sputtering gas; the amount of the nitrogen gas was fixed at 10 mole %.

FIG. 6 shows a plot of the atom % of hydrogen and nitrogen measured in a carbon film versus $H_2\%$ in the sputtering gas; the amount of the nitrogen gas is fixed at 10 mole %. Unlike FIG. 5, the hydrogen atomic density in the carbon film increased significantly, when the $H_2\%$ in the sputtering gas increased. However, the nitrogen atom density remained essentially constant even with a substantial increase of $H_2\%$ in the sputtering gas. This indicates that nitrogen is less effective in changing the film composition, and hydrogen is more reactive than nitrogen during the sputtering process.

Figure 7:
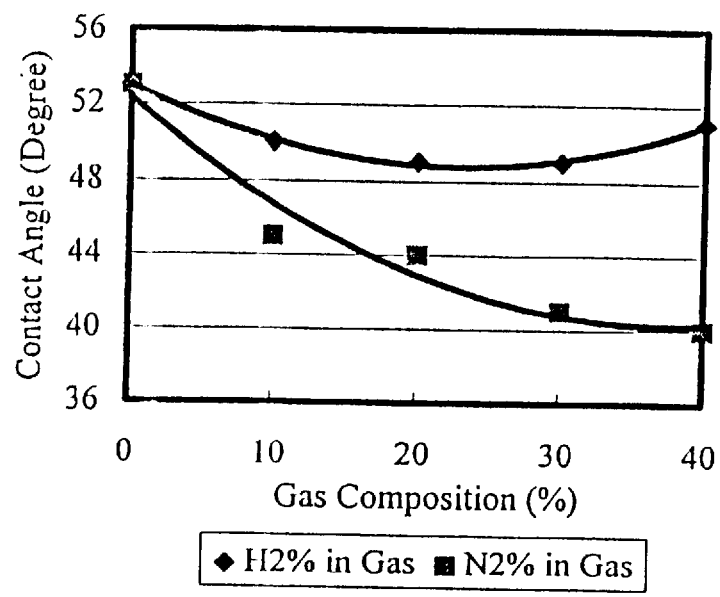
FIG. 7 is a plot of contact angle measured from a carbon film versus $N_2\%$ and $H_2\%$ in the sputtering gas.
Figure 8:
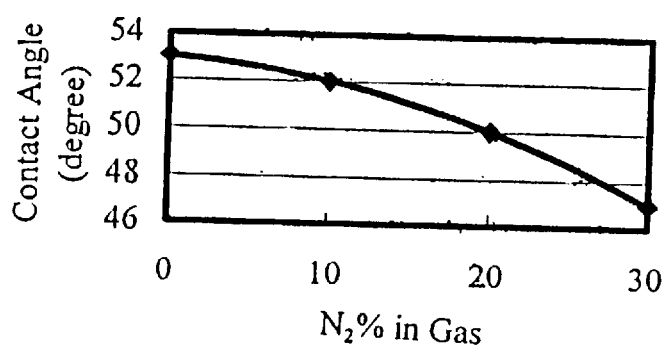
FIG. 8 is a plot of contact angle measured from a carbon film versus $N_2\%$ in the sputtering gas; the amount of hydrogen is fixed at 10 mole %.
Figure 9A:
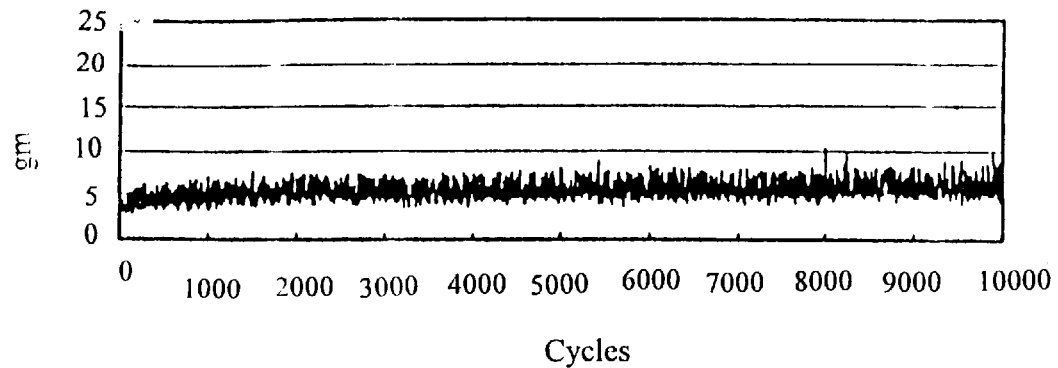
FIG. 9A–9D show the SDCSS results obtained from four different carbon overcoats at $N_2/H_2$ ratios of 0.5, 0.33, 1.00, and 2.00, respectively.
Figure 9B:
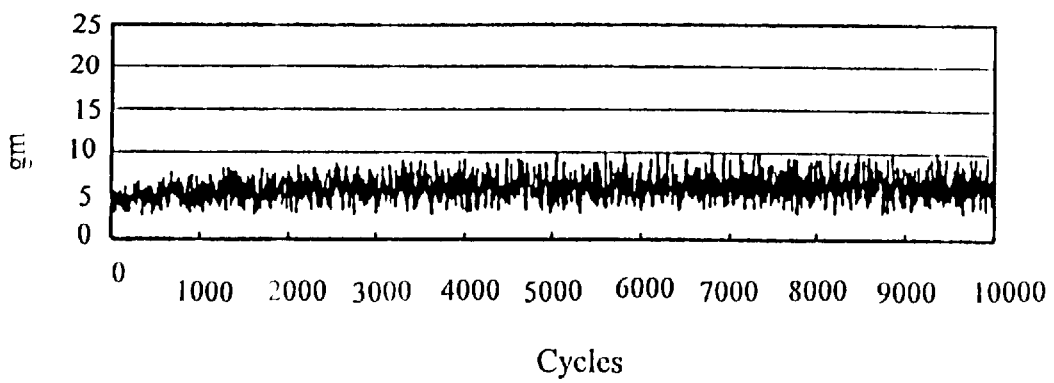
Figure 9C:
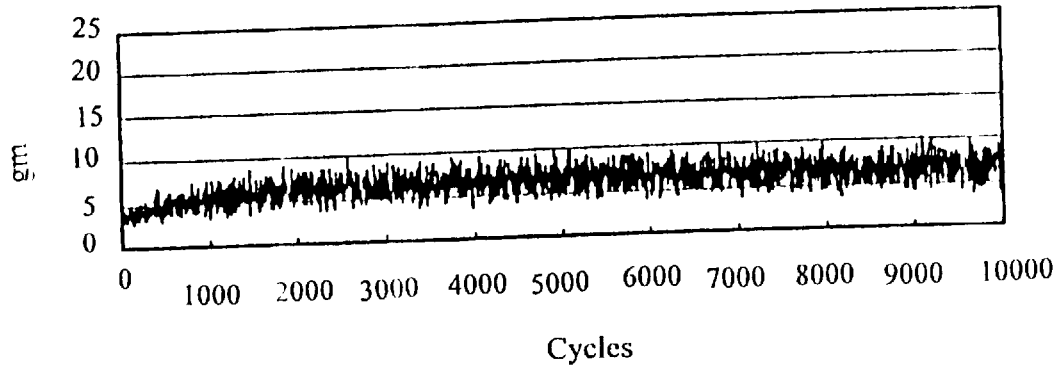
Figure 9D:
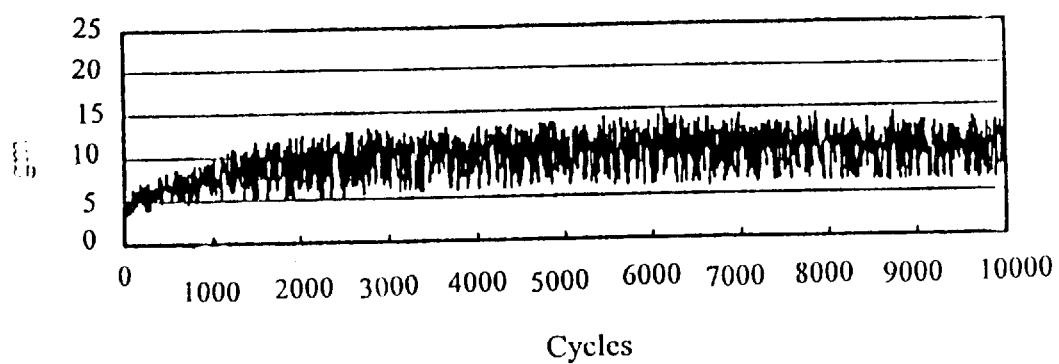

FIG. 7 is a plot of contact angle measured from a carbon film versus $N_2\%$ and $H_2\%$ in the sputtering gas. FIG. 7 shows that adding $N_2$ into the sputtering gas would cause the contact angle to drop significantly. On the other hand, the presence of $H_2$ did not cause noticeable decrease in the contact angle. After the $H_2$ concentration reached a certain level, the increase in H2 could also result in increase in the contact angle. FIG. 8 is a plot of contact angle measured from a carbon film versus $N_2\%$ % in the sputtering gas; the amount of hydrogen is fixed at 10 mole %. Comparing FIGS. 7 and 8, wherein the former involved carbon films doped with $N_2$ or $H_2$ separately whereas the latter involved carbon films doped with both $H_2$ and $N_2$, it is clear that the presence of $H_2$ impeded the benefit of doping with $N_2$, in term of the extent of decrease in the contact angle. The significant decrease in contact angle in the presence of $N_2$ indicates that $N_2$ can induce dangling bonds to the carbon film, thus promoting its bonding with the lubricating layer. The presence of $H_2$, however, hindered this benefit.

FIG. 9A–9D show the SDCSS results obtained from four different carbon overcoats at $N_2/H_2$ ratios of 0.5, 0.33, 1.00, and 2.00, respectively. It appeared that a $N_2/H_2$ ratio between 0.5 and 1.0 provided optimum results.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of preparing thin-film magnetic recording media comprising the step of sputtering a carbon overcoat on a magnetic recording layer, wherein said sputtering is conducted in a sputtering chamber having an inert gas and a mixture of nitrogen gas and hydrogen gas provided at a mole ratio of nitrogen/hydrogen between about 0.5 and about 1.

2. The method of preparing thin-film magnetic recording media according to claim 1 wherein said sputtering chamber contains between about 10 and about 30 mole percent of nitrogen gas.

3. The method of preparing thin-film magnetic recording media according to claim 1 wherein said sputtering chamber has a sputtering pressure of about 7.0 mtorr.

4. The method of preparing thin-film magnetic recording media according to claim 1 wherein said sputtering chamber has a base pressure of about $2 \times 10^{-6}$ torr.

5. The method of preparing thin-film magnetic recording media according to claim 1 wherein said inert gas is argon.

6. The method of preparing thin-film magnetic recording media according to claim 1 wherein said magnetic recording layer contains cobalt-based alloy.

7. The method of preparing thin-film magnetic recording media according to claim 1 which further comprises sputtering an underlayer on a substrate before sputtering said magnetic recording layer.

* * * * *